(12) United States Patent
Katou

(10) Patent No.: US 7,569,467 B2
(45) Date of Patent: Aug. 4, 2009

(54) SEMICONDUCTOR DEVICE AND MANUFACTURING METHOD THEREOF

(75) Inventor: Hiroaki Katou, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 299 days.

(21) Appl. No.: 11/543,791

(22) Filed: Oct. 6, 2006

(65) Prior Publication Data

US 2007/0082488 A1    Apr. 12, 2007

(30) Foreign Application Priority Data

Oct. 11, 2005    (JP)    ............... 2005-296864

(51) Int. Cl.
*H01L 21/4763* (2006.01)
(52) U.S. Cl. .............. 438/592; 438/597; 438/624; 438/635; 438/658; 438/687; 257/E21.508; 257/E21.576; 257/E21.582; 257/E21.591; 257/E21.592
(58) Field of Classification Search .............. 438/618, 438/687
See application file for complete search history.

(56) References Cited

U.S. PATENT DOCUMENTS

| | | | |
|---|---|---|---|
| 6,777,811 B2 * | 8/2004 | Harada | 257/762 |
| 6,867,135 B1 * | 3/2005 | Bao et al. | 438/687 |
| 6,869,873 B2 * | 3/2005 | Bradshaw et al. | 438/630 |
| 6,949,461 B2 * | 9/2005 | Malhotra et al. | 438/643 |
| 6,958,547 B2 * | 10/2005 | Dubin et al. | 257/774 |
| 7,067,421 B2 * | 6/2006 | Ahn et al. | 438/649 |
| 7,135,775 B2 * | 11/2006 | Chambers et al. | 257/762 |
| 7,229,911 B2 * | 6/2007 | Rajagopalan et al. | 438/624 |
| 7,268,073 B2 * | 9/2007 | Ramappa et al. | 438/652 |
| 7,329,607 B2 * | 2/2008 | Chopra et al. | 438/687 |
| 7,413,985 B2 * | 8/2008 | Streck et al. | 438/687 |
| 2003/0173671 A1 * | 9/2003 | Hironaga et al. | 257/758 |
| 2004/0130030 A1 * | 7/2004 | Kunimune et al. | 257/758 |
| 2005/0245065 A1 * | 11/2005 | Motoyama | 438/618 |
| 2005/0275110 A1 * | 12/2005 | Maekawa et al. | 257/760 |

FOREIGN PATENT DOCUMENTS

| | | |
|---|---|---|
| JP | 9-321045 | 12/1997 |
| JP | 2004-96052 A | 3/2004 |
| JP | 2005-251991 A | 9/2005 |

* cited by examiner

*Primary Examiner*—Michael S Lebentritt
(74) *Attorney, Agent, or Firm*—Young & Thompson

(57) ABSTRACT

A semiconductor device has a multi-layer wiring in which resistance against migration of the semiconductor device is raised to improve the yield. Semiconductor device 100 includes a first interconnect (wiring) 112, formed in a first interlayer insulating film 106 on a semiconductor substrate, not shown, a via 128 provided on the first interconnect (wiring) 112 so that the via is connected to the first interconnect (wiring) 112, and a different element containing electrically conductive film 114. The different element containing electrically conductive film is formed selectively on a site on the top of the first interconnect (wiring) 112 where the first wiring is contacted with the bottom of the via 128. The different element containing electrically conductive film contains a metal of a main component of the first interconnect (wiring) 112 and a different element different from the metal of the main component.

10 Claims, 9 Drawing Sheets

SEMICONDUCTOR DEVICE AND MANUFACTURING METHOD THEREOF

FIELD OF THE INVENTION

This invention relates to a semiconductor device and a manufacturing method thereof.

BACKGROUND OF THE INVENTION

Recently, copper wirings (interconnects) have come to be used as metal wirings in semiconductor devices for decreasing the electrical resistance. However, if copper wirings are used, electromigration or stress migration of copper wirings at the bottom of via-holes, adapted for forming vias to be connected to the copper wirings, is becoming of a problem. Patent Document 1 discloses a technique comprising forming copper silicide on the top of a copper wiring formed by a copper-containing metal followed by forming a via thereon. This improves resistance against migration of the copper wiring.

Patent Document 2 discloses a technique comprising exposing a layered structure, composed of a Cu film sandwiched between barrier films, to a silane gas, and selectively forming a copper silicide layer only on a portion of the wiring where copper has been exposed.

[Patent Document 1]
   Japanese Patent Kokai Publication No. JP-P2004-96052A

[Patent Document 2]
   Japanese Patent Kokai Publication No. JP-A-9-321045

SUMMARY OF THE DISCLOSURE

However, in the techniques disclosed in the above Publications, there is still a room for improvement in the following respects:

That is, in the method for forming copper silicide, disclosed in the above Patent Document 1, copper silicide is formed on the entire upper surface of the copper wiring, with the result that wiring resistance of the copper wiring becomes higher.

A semiconductor device according to the present invention includes: a semiconductor substrate; wiring provided in an insulating film on the semiconductor substrate; a via formed on the wiring, the via being connected to the wiring; and a different element containing electrically conductive film selectively formed at a location on the top of the wiring where the wiring is connected to the bottom of the via. The different element containing electrically conductive film contains a metal of a main component of the wiring silicon, and a metal different from the metal of the main component.

A method for manufacturing a semiconductor device according to the present invention includes the steps of: forming a wiring on a semiconductor substrate; forming an insulating film covering the wiring; selectively removing the insulating film to form a via hole reaching the upper surface of the wiring; selectively forming a different element containing electrically conductive film, containing a metal of a main component of the wiring and a metal different from the metal of the main component, in an exposed portion of the upper surface of the wiring; and filling the inner space of the via hole with a metal material to form a via connecting to the wiring.

According to the present invention, a different element containing electrically conductive film is selectively formed on a site on the top of the wiring where the wiring is connected to the bottom of the via, so that it is possible to raise the resistance of the wiring against migration and to suppress the resistance of the wiring from increasing. Moreover, since the different element containing electrically conductive film may be formed using, as a mask, the insulating film, in which the via hole for forming the via has been formed, the different element containing electrically conductive film may selectively be formed on the bottom of the via without the necessity of adding e.g. a photoresist process as a new step.

The wiring may be made up by a wiring metal film having a perimeter formed of a barrier metal film. In this case, the 'metal of the main component of the wiring' may be metal from which the wiring metal layer is mostly (or predominantly) formed. The metal of the main component of the wiring may be copper or a noble metal, such as silver.

In case the metal as the main component of the wiring is copper (Cu), the different element may contain one or more elements selected from among Si, Ag, W, Mg, Be, Zn, Pd, Cd, Au, Hg, Be, Pt, Si, Zr, Ti or Sn. In case the metal of the main component of the wiring is silver (Ag), the different element may be one or more elements selected from among Si, Cu, W, Mg, Be, Zn, Pd, Cd, Au, Hg, Be, Pt, Si, Zr, Ti and Sn. In case Si is used as a different element, the surface of the wiring metal film may be silicided to form a silicide layer to raise the resistance of the wiring against the migration. Moreover, by forming the different element containing electrically conductive film from an alloy of the metal of the main component of the wiring and a different metal, the semiconductor device may be improved in strength. This protects the wiring surface and reduces the stress migration of the wiring.

In the semiconductor device of the present invention, a film having a diffusion preventive function for the aforementioned metal of the main component may be formed in an area on the top of the wiring different from the area where the different element containing electrically conductive film is formed. The film having the diffusion preventive function may, for example, be a barrier insulating film, such as a film of SiC, SiCN, SiOC or SiON, or a cap metal film, such as a film of CoWP, NiWP, CoWB or NiWB.

According to the present invention, there is provided a semiconductor device comprising: a semiconductor substrate; a wiring provided in an insulating film on the semiconductor substrate and formed by a copper-containing metal film; a via formed on the wiring so that the via is connected to the wiring; and a copper silicide layer selectively formed on a site of the top of the wiring where the wiring is connected to the bottom of the via.

The meritorious effects of the present invention are summarized as follows.

According to the present invention, it is possible to raise the resistance against migration of the semiconductor device including a multi-layer wiring structure to improve the yield.

PREFERRED EMBODIMENTS OF THE INVENTION

Figure 1:
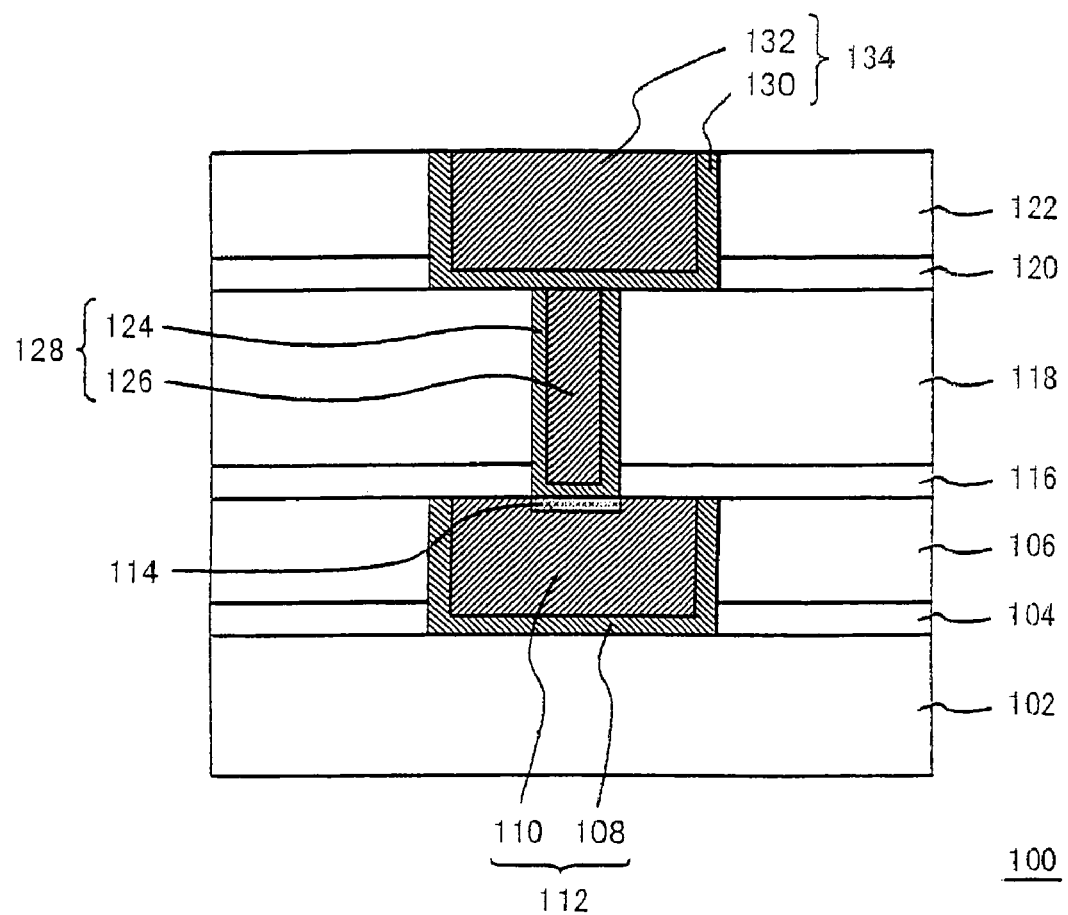
FIG. 1 is a cross-sectional view showing an example of the constitution of a semiconductor device according to an embodiment of the present invention.

Referring to the drawings, a preferred embodiment of the present invention will be described in detail. Meanwhile, the same reference numerals are used to depict the same components and corresponding description is sometimes omitted for simplicity of the description.

FIG. 1 depicts a cross-sectional view showing an example of the constitution of a semiconductor device of the instant embodiment.

A semiconductor device 100 includes a semiconductor substrate, not shown, on which there are formed an insulating film 102, a first etching stop film 104, a first interlayer insulating film 106, a barrier insulating film 116, a second interlayer insulating film 118, a second etching stop film 120 and a third interlayer insulating film 122, in this order. In the first etching stop film 104 and in the first interlayer insulating film 106, there is formed a first interconnect (wiring) 112 formed by a barrier metal film 108 and an interconnect (wiring) metal film 110. In the barrier insulating film 116 and in the second interlayer insulating film 118, there is formed a via 128 formed by a barrier metal film 124 and a via metal film 126. In the second etching stop film 120 and in the third interlayer insulating film 122, there is formed a second interconnect (wiring) 134 formed by a barrier metal film 130 and an interconnect (wiring) metal film 132. In the present embodiment, there is selectively formed, on a top part of the first interconnect (wiring) 112, where the first wiring is connected to the bottom of the via 128, a different element containing electrically conductive film 114, which is formed of a metal of a main component of the interconnect (wiring) metal film 110 of the first interconnect (wiring) 112 and a metal different from the metal of the main component of the interconnect (wiring) metal film 110 of the first interconnect (wiring) 112.

In the present embodiment, the semiconductor substrate may be a silicon substrate on which there are formed devices, such as transistors.

In the present embodiment, the interconnect (wiring) metal films 110 and 132, contained in the first interconnect (wiring) 112 and in the second interconnect (wiring) 134, respectively, may be formed by interconnect (wiring) metal films mainly (or predominantly) composed of copper.

The barrier metal films 108, 130, contained in the first interconnect (wiring) 112 and in the second interconnect (wiring) 134, respectively, may be formed of "high melting point" metals, such as Ti, W or Ta. Preferably, the barrier metal films may be formed of, for example, Ti, TiN, W, WN, Ta or TaN. In particular, a tantalum-based barrier metal film, obtained on laminating TaN and Ta together, is preferred.

Similarly to the interconnect (wiring) metal films 110 and 132, the via metal film 126 of the via 128 may be formed as a copper-containing metal film. The barrier metal layer 124 may be formed as a barrier metal film similar to the barrier metal film 108 or 130. The via 128 may contain a material, such as W, embedded (or implanted) therein.

In the present embodiment, the first interlayer insulating film 106 and the third interlayer insulating film 122 may be formed as low dielectric constant film with a specific dielectric constant not higher than 3.3 and preferably not higher than 2.9. The first interlayer insulating film 106 and the third interlayer insulating film 122 may be formed as films of, for example, SiOC (SiOCH), methyl silsesquioxane (MSQ), hydrogenated methyl silsesquioxane (MHSQ) or organic polysiloxane. These films may be porous films, if desired. The first interlayer insulating film 106 and the third interlayer insulating film 122 may be formed of the same material or different materials. In the present embodiment, the second interlayer insulating film 118 may be formed of, for example, a silicon oxide film. Similarly to the first interlayer insulating film 106 or the third interlayer insulating film 122, the second interlayer insulating film 118 may also be formed as a low dielectric constant film.

In the present embodiment, the first etching stop film 104 and the second etching stop film 120 may be formed of, for example, SiC, SiCN, SiOC or SiON. In the present embodiment, the barrier insulating film 116 may also be formed of, for example, SiC, SiCN, SiOC or SiON. The first etching stop film 104, second etching stop film 120 and the barrier insulating film 116 operate as copper diffusion preventive films.

In the present embodiment, the different element containing electrically conductive film 114 may be a copper silicide layer containing copper and Si. Silicidation is by radiating a Si containing gas on the surface of the interconnect (wiring) metal film 110. The Si containing gas may, for example, be monosilane, disilane, trisilane or tetrasilane, diluted with an inert gas, such as nitrogen. By using a gas obtained on diluting the silicon containing gas with the inert gas, it is possible to slow down the rate of silicidation and to control the film thickness of the copper silicide layer to a desired magnitude.

In case the wirings are formed mainly of a material susceptible to electromigration or stress migration, such migration tends to be produced at a site of connection between the wirings and the vias, that is, at the bottoms of the vias. In the present embodiment, in which the different element containing electrically conductive film 114 is formed at the bottom of the via, the resistance against migration of (elements contained in) the first interconnect (wiring) 112 may be improved, while the resistance of the first interconnect (wiring) 112 can be prevented from increasing.

Figure 2:
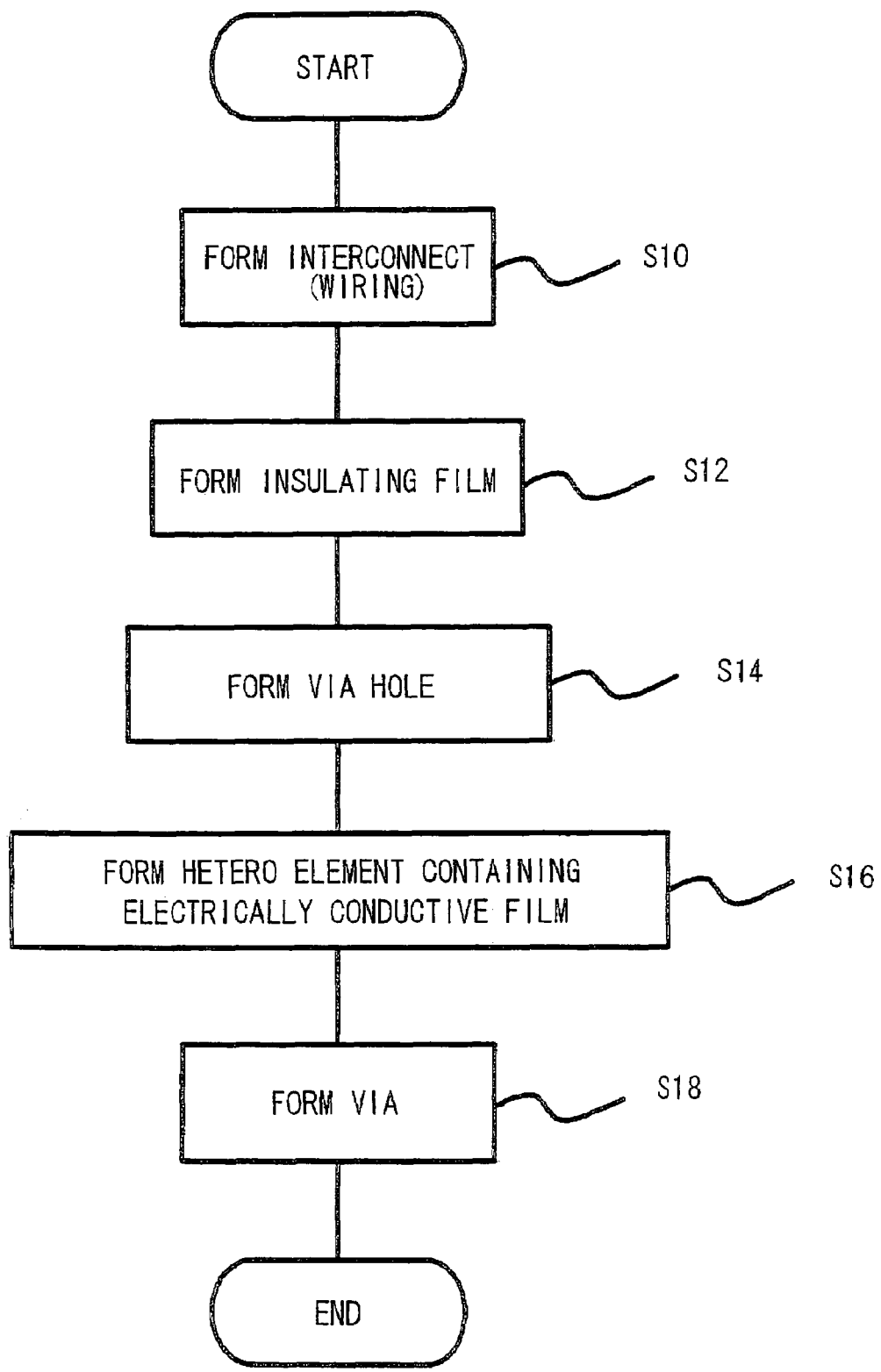
FIG. 2 is a flowchart showing a manufacturing sequence for the semiconductor device of the present embodiment.

FIG. 2 depicts a flowchart showing a part of the sequence of operations for manufacturing the semiconductor device 100 of the instant embodiment. Here, the process for forming the first interconnect (wiring) 112 and the different element containing electrically conductive film 114 will be described. In the following, an example of forming an wiring by a single Damascene process is shown. It is noted that, in the following, reference is also made to FIG. 1 for explanation.

Initially, a trench is formed in the first etching stop film 104 and in the first interlayer insulating film 106, both formed on a semiconductor substrate, not shown. A barrier metal film 108 then is formed on the entire surface of the semiconductor substrate so that the barrier metal film 108 is formed on the bottom and sidewall sections of the trench. An interconnect (wiring) metal film 110 then is formed on the entire surface of the semiconductor substrate so that the interconnect (wiring) metal film 110 is buried within the trench. The portions of the interconnect (wiring) metal film 110 and the barrier metal film 108, exposed to outside the trench, are then removed by chemical mechanical polishing (CMP). By so doing, a first interconnect (wiring) 112 is formed (S10).

A barrier insulating film 116 and a second interlayer insulating film 118 (insulating film) are then formed on the first interlayer insulating film 106 (S12). A via hole then is formed in the second interlayer insulating film 118 and in the barrier insulating film 116 to expose the surface of the interconnect (wiring) metal film 110 of the first interconnect (wiring) 112 (S14). A different element containing electrically conductive film 114 is then formed on the exposed surface of the interconnect (wiring) metal film 110 (S16) (bottom area of the trench). A barrier metal layer 124 and a via metal film 126 are sequentially formed on the entire surface of the semiconductor substrate so that the barrier metal layer 124 and the via metal film 126 are buried in the via hole. Portions of the via metal film 126 and the barrier metal layer 124, exposed to outside the via hole, are removed by CMP to from a via 128 (S18).

By the above process, the different element containing electrically conductive film 114 may selectively be formed at a connection point of the first interconnect (wiring) 112 with the bottom area of the via 128. Since the different element containing electrically conductive film 114 is formed with use of the via holes, formed at the time of forming the layered (laminated) structure of the semiconductor device 100, as a pattern, the different element containing electrically conductive film 114 can selectively be formed at the bottom area of each via 128, without the necessity of adding a photoresist process as a new step.

FIGS. 3A to 5C depict cross-sectional views for illustrating the process for manufacturing the semiconductor device 100 of the instant embodiment. The method for manufacturing the semiconductor circuit 100, shown in FIG. 1, will now be described in detail with reference to FIGS. 3A to 5C.

Figure 3A:
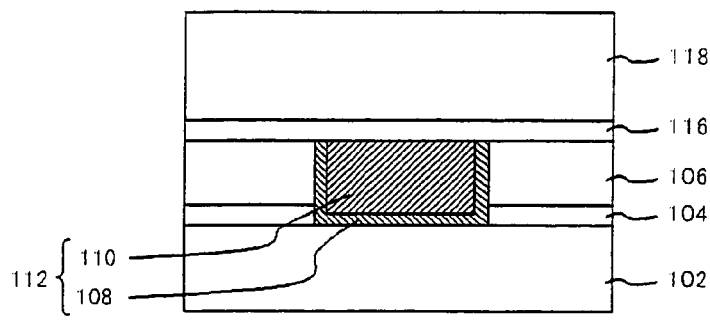
FIGS. 3A, 3B, 3C and 3D are cross-sectional views showing the manufacturing sequence for the semiconductor device of the present embodiment.

FIG. 3A shows a structure in which the first interconnect (wiring) 112 has been formed in the first etching stop film 104 and in the first interlayer insulating film 106. This structure may be formed by the following sequence of operations. Initially, the first etching stop film 104 and the first interlayer insulating film 106 are formed on the insulating film 102. A resist film, not shown, patterned to a preset shape, is then provided on the first interlayer insulating film 106, and the first etching stop film 104 and the first interlayer insulating film 106 are stepwise etched.

The barrier metal layer 108 is then formed on the entire substrate surface by e.g., a sputtering method, CVD or the like. The barrier metal layer 108 may, for example, be formed by layering (laminating) Ta and TaN films. The interconnect (wiring) metal film 110 then is formed on the barrier metal layer 108. The interconnect (wiring) metal film 110 may be formed, e.g., by plating. It is noted that the interconnect (wiring) metal film 110 may be a copper-containing metal film, in which copper represents the main (or predominant) component.

Then, unneeded portions of the interconnect (wiring) metal film 110 and the barrier metal layer 108, formed outside the trench, are then removed by CMP to such an extent that the interconnect (wiring) metal film 110 and the barrier metal layer 108 will be left only within the trench. This forms the first interconnect (wiring) 112. The barrier insulating film 116 and the second interlayer insulating film 118 are then sequentially formed on the first interlayer insulating film 106 to entirely cover the first interconnect (wiring) 112 (FIG. 3A).

Figure 3B:
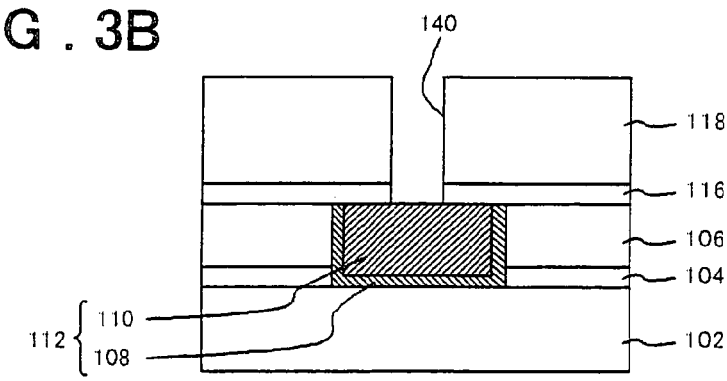

Then, in accordance with the lithographic method, a resist film, not shown, having a patterned opening of a preset shape, is formed on the second interlayer insulating film 118, which second interlayer insulating film 118 then is etched until the barrier insulating film 116 is exposed. The etching gas is then replaced by a new step etching gas and, with the use of the new etching gas, the barrier insulating film 116 is etched to form a via hole 140 to expose the upper surface of the interconnect (wiring) metal film 110 (the bottom surface of the via 140) (FIG. 3B). At this time, the resist film, formed on the second interlayer insulating film 118, may also be peeled off (removed).

Figure 3C:
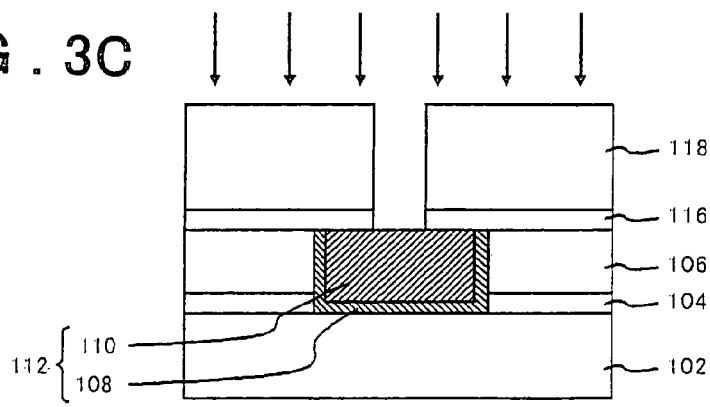
Figure 3D:
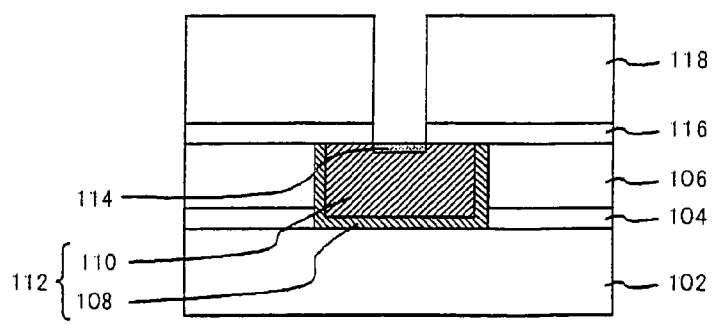

A Si-containing gas is then radiated (FIG. 3C). This causes the copper of the interconnect (wiring) metal film 110, exposed on the bottom of the via hole 140, to be reacted with Si, so that a different element containing electrically conductive film 114, formed by a copper silicide layer, is formed at the exposed portion of the interconnect (wiring) metal film 110 (FIG. 3D). The Si-containing gas may be a silane gas. The silane gas may be radiated using, e.g., a gas mixture of $SiH_4$ and an inert gas, such as or $N_2$.

In another embodiment, the different element containing electrically conductive film 114 may be formed on the exposed portion of the interconnect (wiring) metal film 110 by implanting Si in the interconnect (wiring) metal film 110 exposed on the bottom of the via hole 140, before removing the resist film formed on the second interlayer insulating film 118, with the use of the resist film still intact and the second interlayer insulating film 118 as masks, followed by carrying out heating approximately at 200 to 1000° C. approximately for 30 to 120 minutes. In this case, the resist film, formed on the second interlayer insulating film 118, is removed after forming the different element containing electrically conductive film 114.

In the second embodiment, described above, since the different element containing electrically conductive film 114 may be formed with the use of the second interlayer insulating film 118 and the barrier insulating film 116, as masks, it is possible to form the different element containing electrically conductive film 114 in a desired manner without adding a photoresist step to the routine manufacturing process for the semiconductor device.

Figure 4A:
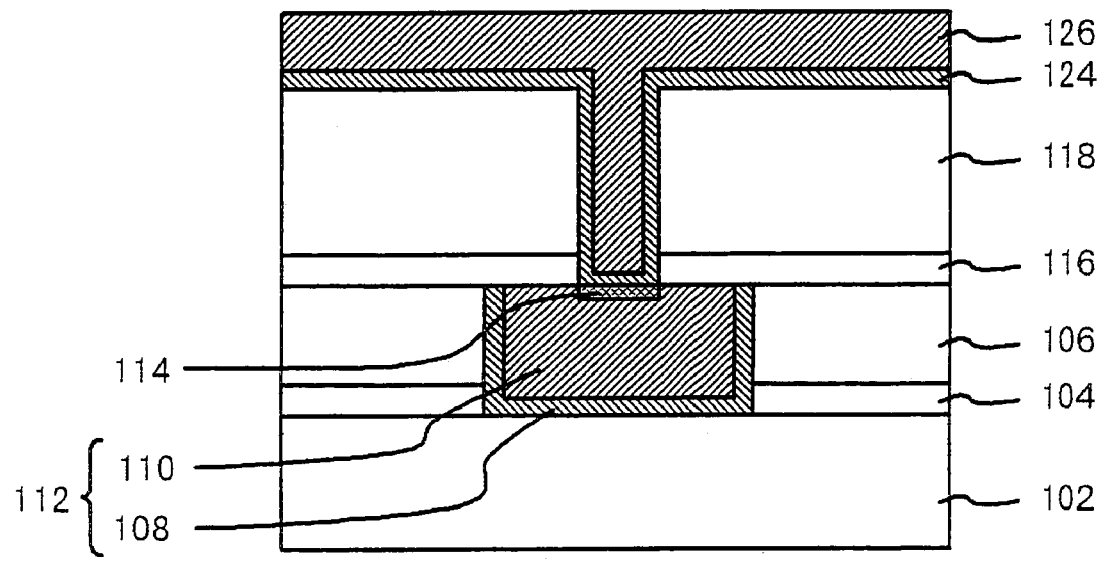
FIGS. 4A and 4B, continuing to FIGS. 3A-3D, are cross-sectional views showing the manufacturing sequence for the semiconductor device of the present embodiment.
Figure 4B:
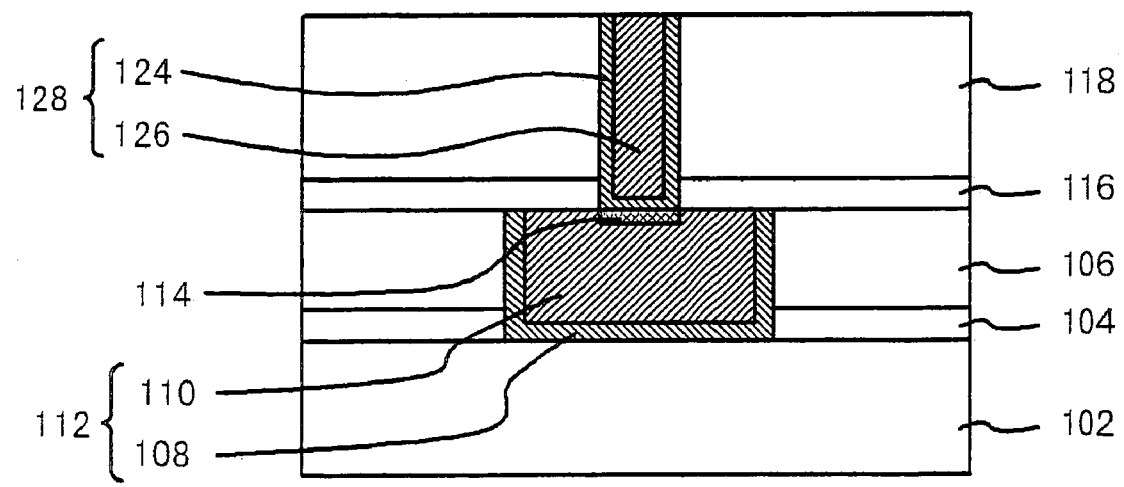

A barrier metal layer 124 and a via metal film 126 are then formed in this order to fill in the inner space of the via hole 140 (FIG. 4A). Similarly to the interconnect (wiring) metal film 110 of the first interconnect (wiring) 112, the via metal film 126 may be formed by a plating method. Then, planarization is carried out by CMP to form the via 128 (FIG. 4B).

Figure 5A:
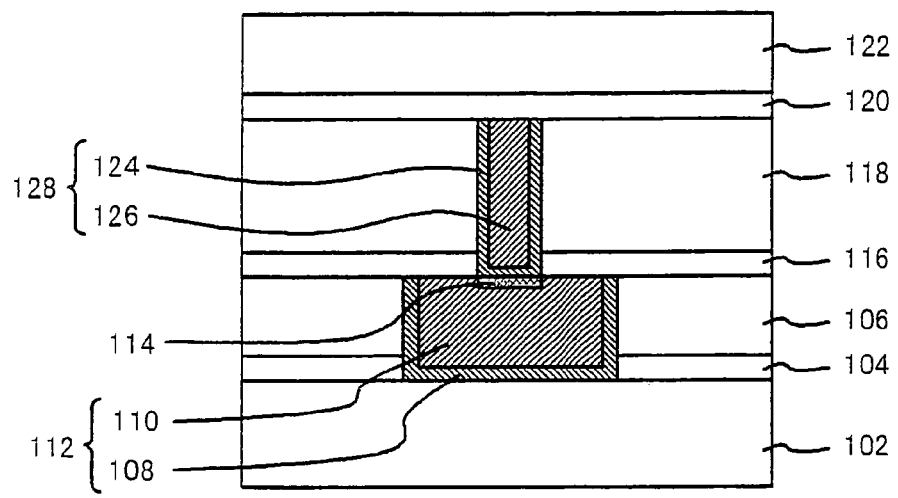
FIGS. 5A, 5B and 5C, continuing to FIGS. 4A and 4B, are cross-sectional views showing the manufacturing sequence for the semiconductor device of the present embodiment.
Figure 5B:
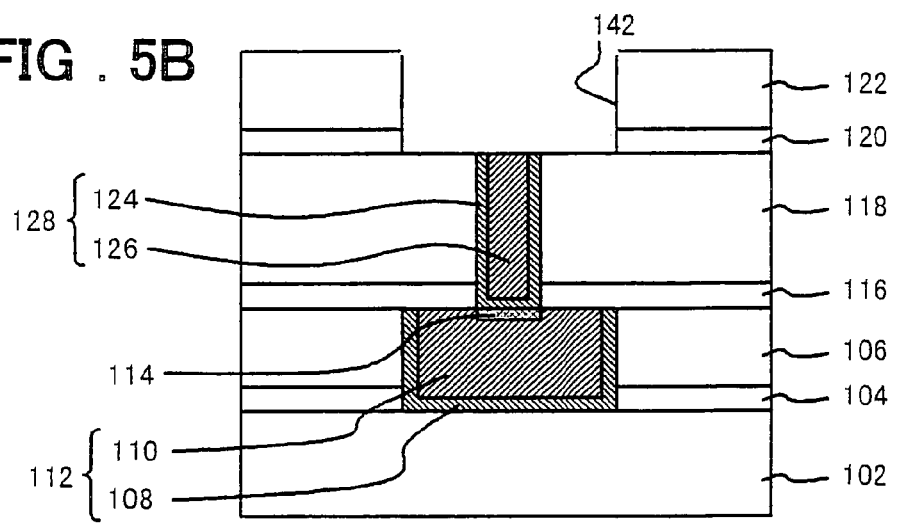
Figure 5C:
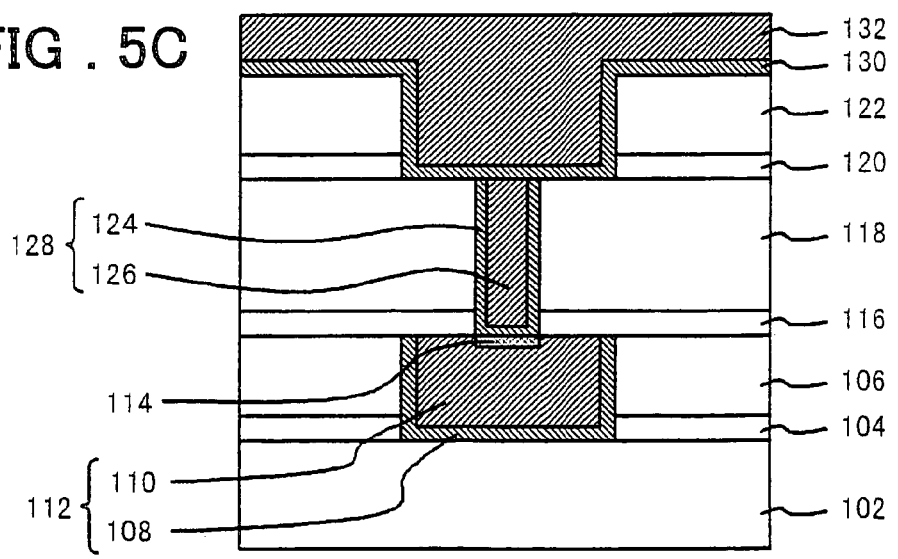

Then, a second etching stop film 120 and a third interlayer insulating film 122 are sequentially formed on the top of the via 128 (FIG. 5A). A trench 142 then is formed by dry etching (FIG. 5B). A barrier metal film 130 and an interconnect (wiring) metal film 132 are then formed in this order to fill in the inner space of the trench 142 (FIG. 5C). Then, planarization is carried out by CMP to form a second interconnect (wiring) 134.

The semiconductor device 100 of the multi-layer structure may be produced by repeating the above process steps.

Figure 6:
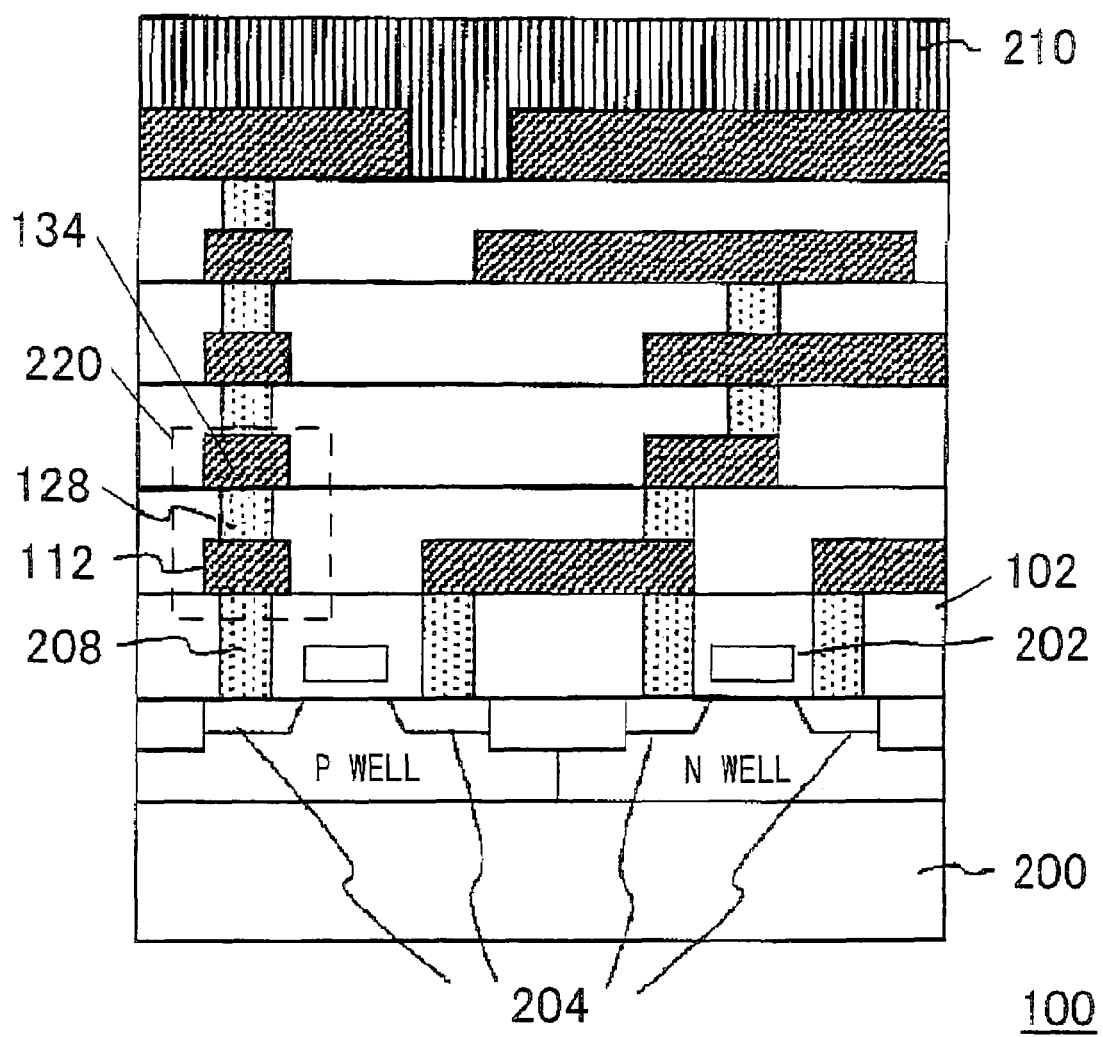
FIG. 6 is a cross-sectional view schematically showing the constitution of a semiconductor device according to a modification of the present invention.

FIG. 6 depicts a schematic cross-sectional view showing an example of the semiconductor device 100 of the instant embodiment. A MOS transistor, formed, e.g., by a gate electrode 202 and a diffusion layer 204, is formed on a semiconductor substrate 200 which is a silicon substrate. An insulating layer 102 is formed so as to embed MOS transistors. In the insulating layer 102, there is formed a via (vias) 208 for connection to the diffusion layer 204. A first interconnect (wiring) 112, a via 128 and a second interconnect (wiring) 134 are formed in this order on top of the via 208. On top of the layer, including these wirings, there are formed a plural number of wiring layers of a similar structure. On the topmost part of these wiring layers, there is provided a passivation layer 210. Meanwhile, the first interconnect (wiring) 112 is electrically connected to, e.g., a device formed on the semiconductor substrate 200. The configuration shown in FIG. 1 corresponds to the configuration shown encircled in a broken line rectangle 220 in FIG. 6. The first interconnect (wiring) 112, via 128 and the second interconnect (wiring) 134, described above, may be provided in any layer (or layers) of the semiconductor device shown in FIG. 1.

An example in which the interconnection is formed by a dual Damascene process will now be described.

FIG. 7 is a cross-sectional view showing another example of the manufacturing sequence for a semiconductor device 100 of the present embodiment. Reference is also made to FIGS. 3A to 5C in the following explanation. The process steps similar to those explained with reference to FIGS. 3A to 5C are sometimes omitted from the explanation.

Initially, the structure explained with reference to FIG. 3A is formed in the same way as explained with reference to FIG. 3A, with the exception that an interlayer insulating film 150 is formed, in place of the second interlayer insulating film 118, on the top of the barrier insulating film 116. The interlayer insulating film 150 may be formed by a low dielectric constant film similar to the first interlayer insulating film 106 or to the third interlayer insulating film 122. The interlayer insulating film 150 may be formed by plural layers composed of, for example, a low dielectric insulating film(s) and an etching stop film(s).

Figure 7A:
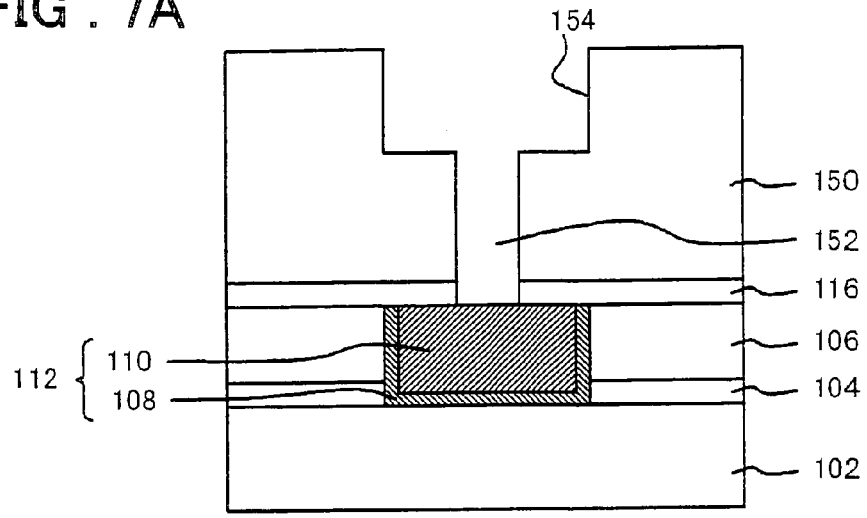
FIGS. 7A, 7B and 7C are cross-sectional views showing the manufacturing sequence for the semiconductor device of the present modification.

A resist film, not shown, having an opening of a preset shape, is formed on the interlayer insulating film 150, by a lithographic process. Then, a trench 154 and a via hole 152 are formed in the interlayer insulating film 150 by stepwise (progressive) etching. The etching gas is then replaced by a new one and, with the use of the new etching gas, the barrier insulating film 116 is etched to expose the surface of the underlying interconnect (wiring) metal film 110 at the bottom of the via hole 152 (FIG. 7A). At this time, the resist film, formed on the second interlayer insulating film 150, may also be peeled off.

Figure 7B:
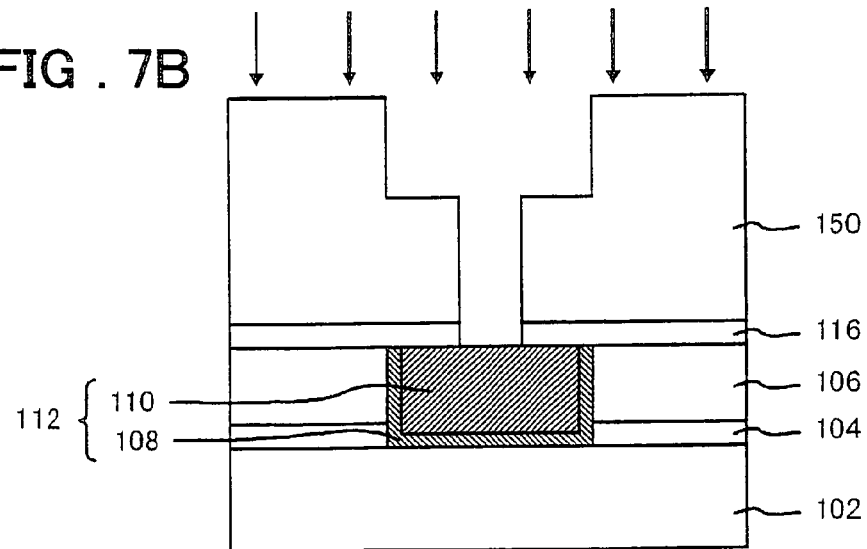
Figure 7C:
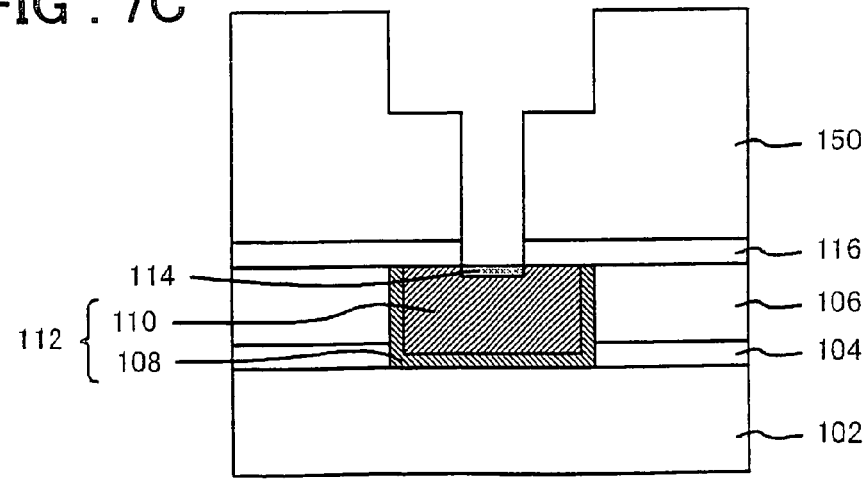

A Si-containing gas (e.g., silane) is then irradiated (FIG. 7B). This causes copper in the interconnect (wiring) metal film 110, exposed on the bottom of the via hole 152, to be reacted with Si, so that a different element containing electrically conductive film 114, formed by a copper silicide layer, is formed at the exposed portion of the interconnect (wiring) metal film 110 (FIG. 7C). As a modification, a different element containing electrically conductive film 114 may also be formed in a desired manner by implanting Si and carrying out heating before peeling off the resist film formed on the interlayer insulating film 150.

As described above, the different element containing electrically conductive film 114 may be formed, using the interlayer insulating film 150 and the barrier insulating film 116 as masks, even in the dual Damascene process, so that a desired different element containing electrically conductive film 114 may be formed without adding a photoresist process to the routine manufacturing process for the semiconductor device.

Figure 8:
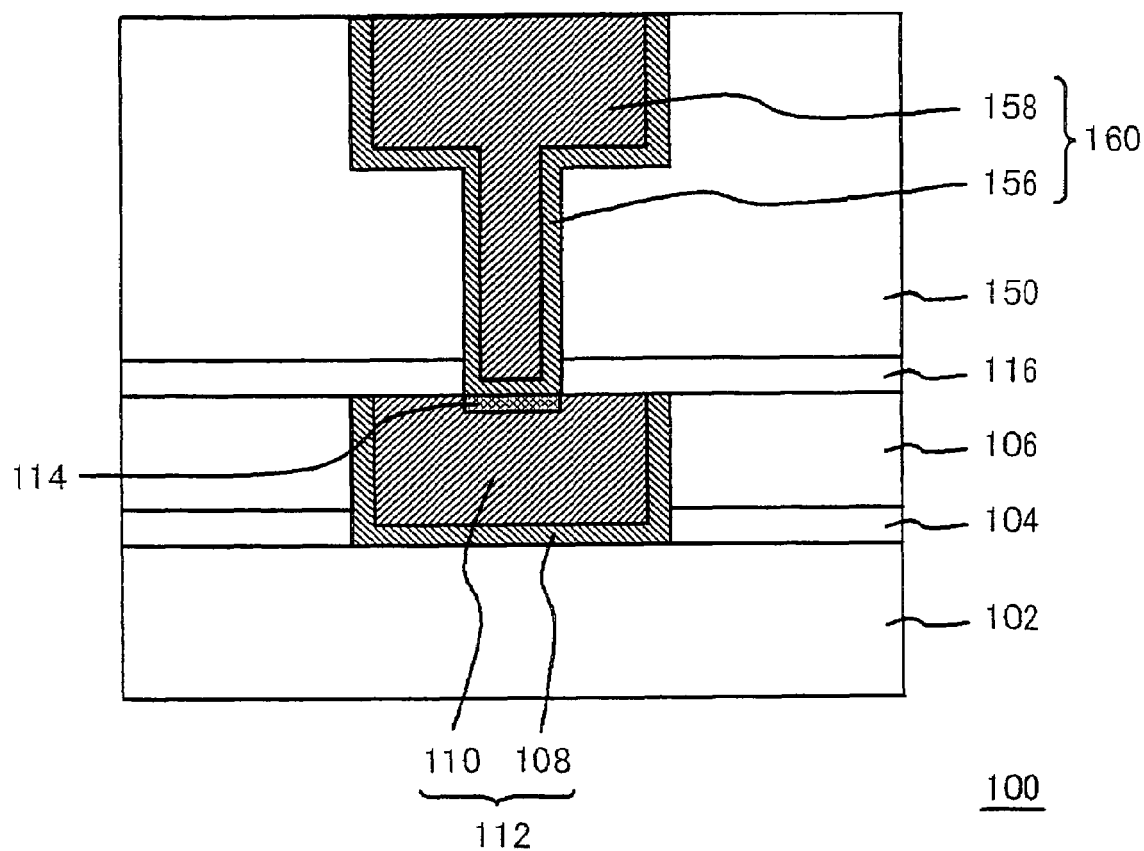
FIG. 8 is a cross-sectional view showing an example of the constitution of a semiconductor device according to a further modification of the present invention.

A barrier metal film 156 and an interconnect (wiring) metal film 158 are then formed on the entire surface of the semiconductor substrate to fill in the via hole 152 and the trench 154. The portions of the interconnect (wiring) metal film 158 and the barrier metal film 156, exposed to (or formed) outside the trench 154, are removed by CMP. This forms a third wiring 160 (FIG. 8).

With the semiconductor device 100 of the instant embodiment, described above, it is possible to suppress the interconnect (wiring) resistance from increasing, and to improve the resistance against migration, such as electromigration or stress migration. These advantages may be obtained without adding a photoresist process step as a new step.

The foregoing description has been made with reference to preferred embodiments of the present invention. It will be appreciated by those skilled in the art that these embodiments are merely illustrative and that a wide variety of changes may be made in the embodiments without departing from the scope of the invention.

In the above-described embodiments, the case in which the different element containing electrically conductive film 114 is a copper silicide layer has been explained, only by way of an example. The different element containing electrically conductive film 114 may, however, be formed by an alloy of copper and a different element(s) other than copper. The different elements may be one or more elements selected from the group of Si, Ag, W, Mg, Be, Zn, Pd, Cd, Au, Hg, Be, Pt, Si, Zr, Ti and Sn, in which case the interconnection may similarly be improved in resistance against migration. The metal as the main component of the wiring metal layer may be, e.g., silver. In this case, electromigration or stress migration may be produced, in general, as in the case of using copper. Even in such case, the configuration of the present invention makes it possible to improve the resistance against migration.

Figure 9:
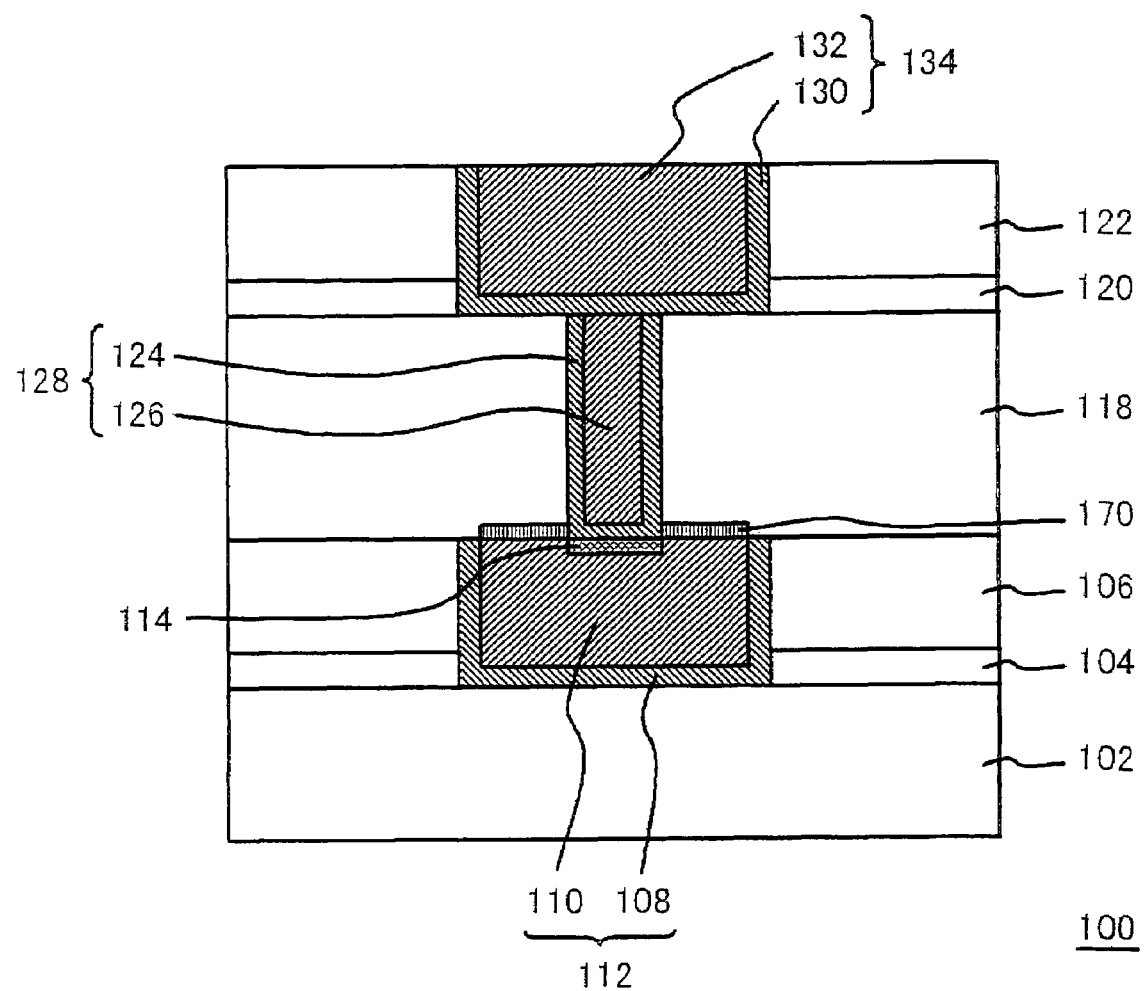
FIG. 9 is a cross-sectional view showing an example of the constitution of a semiconductor device according to a further modification of the present invention.

In the above-described embodiment, the barrier insulating film 116 is formed on the first interconnect (wiring) 112. As a further modification, a cap metal film may be formed, in place of the barrier insulating film 116 (which is formed over the entire layer), only on the first interconnect (wiring) 112. FIG. 9 shows this modification.

The semiconductor device 100 differs from the configuration shown in FIG. 1 in that a cap metal film 170 has been formed, in place of the barrier insulating film 116, only on the first interconnect (wiring) 112.

The cap metal film 170 may be formed of, for example, CoWP, NiWP, CoWB or NiWB. The cap metal film 170 is formed by forming the first interconnect (wiring) 112 on the first etching stop film 104 and on the first interlayer insulating film 106 and subsequently causing a plating solution, containing, e.g., cobalt or nickel, to act on the entire surface of a semiconductor substrate, by a selective plating method. Thereafter, the second interlayer insulating film 118 is formed on the first interlayer insulating film 106, and a via hole then is formed. The cap metal film 170 on the bottom of the via hole is also etched off at this time to expose the surface of the interconnect (wiring) metal film 110. A silane gas, for example, is then irradiated, as described above, to form a different element containing electrically conductive film 114 on the portion of the surface of the interconnect (wiring) metal film 110 exposed on the bottom of the via hole. In this manner, there may be obtained a semiconductor device 100 configured as shown in FIG. 9.

In such case, since the different element containing electrically conductive film 114, formed of a metal, such as copper, mainly forming the first interconnect (wiring) 112, and a different element(s), is formed on the bottom of the via 128, between the via 128 and the first interconnect (wiring) 112, it is similarly possible to raise the resistance against migration of the first interconnect (wiring) 112.

It should be noted that other objects, features and aspects of the present invention will become apparent in the entire disclosure and that modifications may be done without departing the gist and scope of the present invention as disclosed herein and claimed as appended herewith.

Also it should be noted that any combination of the disclosed and/or claimed elements, matters and/or items may fall under the modifications aforementioned.

What is claimed is:

1. A semiconductor device comprising:
   a semiconductor substrate;
   a wiring provided in an insulating film formed on said semiconductor substrate and containing a first material as a main component, wherein said first material is a metal;
   a via connecting plug formed above said wiring; and
   a connecting portion selectively formed in an upper portion of said wiring and connected to the via connecting plug, said connecting portion comprising an electrically conductive film including a second material, different from said first material,
   wherein said second material of said electrically conductive film contains said first material and a third material, where said third material is selected from the group consisting of at least one of silicon and a metal different from said first material, and
   wherein said wiring is free from said second material.

2. The semiconductor device according to claim 1, wherein said first material is copper.

3. The semiconductor device according to claim 1, wherein said electrically conductive film is a silicide layer of said first material.

4. The semiconductor device according to claim 1, wherein there is formed, in an area on the top of said wiring other than the area where said connecting portion has been formed, a film formed of a material different from the second material, and having a function of preventing diffusion of said first material.

5. A method for manufacturing a semiconductor device comprising:
   forming a wiring on a semiconductor substrate, the wiring containing a first material as a main component, wherein the first material is a metal;
   forming an insulating film covering said wiring;
   selectively removing said insulating film to form a via hole reaching the upper surface of said wiring;
   selectively forming a connecting portion in an upper portion of said wiring which is formed of an electrically conductive film containing said first material and a second material different from the first material, wherein said second material is selected from the group consisting of at least one of silicon and a third material, wherein said third material is a metal different from said first material, so as to provide said connecting portion in said upper surface portion of said wiring through said via hole; and
   filling an inner space of said via hole with a metal material to form a via connecting plug to connect said wiring to said via connecting plug through said connecting portion,
   wherein said wiring is free from said second material.

6. The method for manufacturing a semiconductor device according to claim 5, wherein
   in said forming said electrically conductive film, the exposed portion of the upper surface of said wiring is selectively silicided to form a layer of a silicide of said first material.

7. The method for manufacturing a semiconductor device according to claim 5, wherein
   the first material is copper; and
   wherein in said forming said electrically conductive film, the exposed portion of an upper surface of said wiring is selectively silicided to form a copper silicide layer.

8. The method for manufacturing a semiconductor device according to claim 6, wherein said forming said electrically conductive film includes:
   directing a Si-containing gas to said exposed portion of the upper surface of said wiring.

9. The method for manufacturing a semiconductor device according to claim 6, wherein said siliciding includes:
   implanting Si on said exposed portion of an upper surface of said wiring; and
   a heat-treatment step.

10. The method for manufacturing a semiconductor device according to claim 5, wherein said insulating film forming includes:
   forming a film of a material different from the second material of said electrically conductive film and having a function of preventing diffusion of said metal of the main component; and
   forming an interlayer insulating film on said film having the diffusion preventive function;
   said film having the diffusion preventive function and said interlayer insulating film being selectively removed in said via hole forming to form said via hole.

* * * * *